United States Patent
Yanagisawa (10) Patent No.: US 11,846,649 B2
(45) Date of Patent: Dec. 19, 2023

(54) PHYSICAL QUANTITY SENSOR AND INERTIAL MEASUREMENT UNIT

(71) Applicant: SEIKO EPSON CORPORATION, Tokyo (JP)

(72) Inventor: Yoshinao Yanagisawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 2 days.

(21) Appl. No.: 17/511,993

(22) Filed: Oct. 27, 2021

(65) Prior Publication Data

US 2022/0128590 A1 Apr. 28, 2022

(30) Foreign Application Priority Data

Oct. 28, 2020 (JP) .................................. 2020-180475

(51) Int. Cl.
| | | |
|---|---|---|
| G01P 15/08 | (2006.01) | |
| G01P 1/02 | (2006.01) | |
| B81C 1/00 | (2006.01) | |
| G01P 21/00 | (2006.01) | |

(52) U.S. Cl.
CPC .......... G01P 15/0802 (2013.01); G01P 1/023 (2013.01); *B81C 1/00976* (2013.01); *G01P 21/00* (2013.01)

(58) Field of Classification Search
CPC .............................. B81C 1/00976; G01P 21/00
See application file for complete search history.

(56) References Cited

U.S. PATENT DOCUMENTS

2008/0216572 A1 9/2008 Aoyama
2019/0129042 A1* 5/2019 Yanagisawa ......... B60G 17/019

FOREIGN PATENT DOCUMENTS

| JP | 2008-216118 | 9/2008 | | |
|---|---|---|---|---|
| JP | 2009-075097 | 4/2009 | | |
| JP | 2010-008126 | 1/2010 | | |
| JP | 201429334 A | * | 2/2014 | |
| JP | 201960688 A | * | 4/2019 | |
| WO | WO-2013008263 A1 | * | 1/2013 | ......... G01C 19/5776 |

OTHER PUBLICATIONS

Machine translation of JP201429334A (Year: 2014).*
Machine translation of JP201960688A (Year: 2019).*
Machine translation of WO2013008263A1 (Year: 2013).*

* cited by examiner

*Primary Examiner* — Eman A Alkafawi
*Assistant Examiner* — Sangkyung Lee
(74) *Attorney, Agent, or Firm* — Rankin, Hill & Clark LLP (57) ABSTRACT

A physical quantity sensor includes a physical quantity detection circuit having a determination circuit that determines whether a value of a physical quantity signal continuously remains within a predetermined range in a predetermined period, determines that a physical quantity detection element is in a first state of normal operation when the value does not continuously remain, and determines that the physical quantity detection element is in a second state of abnormal operation when the value continuously remains, a control circuit that stores first information based on a determination result of the determination circuit is stored in a control circuit as a setting information and a communication section that outputs the setting information stored in from the control circuit to the outside when the determination result of the determination circuit indicates the second state.

10 Claims, 10 Drawing Sheets

| X=Enable | SET1 | SET2 | SET3 | SET4 |
|---|---|---|---|---|
| COMMON | VDD | VDD | VSS | VSS |
| XP | VDD | VSS | VDD | VSS |
| XN | VSS | VDD | VSS | VDD |

| Y=Enable | SET1 | SET2 | SET3 | SET4 |
|---|---|---|---|---|
| COMMON | VDD | VDD | VSS | VSS |
| YP | VDD | VSS | VDD | VSS |
| YN | VSS | VDD | VSS | VDD |

| Z=Enable | SET1 | SET2 | SET3 | SET4 |
|---|---|---|---|---|
| COMMON | VDD | VDD | VSS | VSS |
| ZP | VDD | VSS | VDD | VSS |
| ZN | VSS | VDD | VSS | VDD |

PHYSICAL QUANTITY SENSOR AND INERTIAL MEASUREMENT UNIT

The present application is based on, and claims priority from JP Application Serial Number 2020-180475, filed Oct. 28, 2020, the disclosure of which is hereby incorporated by reference herein in its entirety.

BACKGROUND

1. Technical Field

The present disclosure relates to a physical quantity sensor and an inertial measurement unit.

2. Related Art

In recent years, capacitance type physical quantity sensors have been developed that detect a physical quantity by using the fact that a value of capacitance generated between opposing electrodes provided in a physical quantity detection element changes with the magnitude and direction of the physical quantity such as acceleration and angular velocity. For example, capacitance type acceleration sensors and angular velocity sensors using silicon micro electro mechanical systems (MEMS) technology are widely known.

In the capacitance type physical quantity sensor described above, the capacitance becomes very large when the opposing electrodes are stuck to each other, for example, and thus the physical quantity detection element always outputs a detection signal to which a large acceleration seems to be added. Therefore, for example, JP-A-2010-8126 discloses a semiconductor physical quantity sensor capable of peeling a mass portion from a fixed electrode even if the mass portion is stuck to the fixed electrode by providing an electrode on a surface opposite to the fixed electrode facing the mass portion where one of opposing electrodes is provided and applying a voltage between the electrode and an electrode provided on a lower glass substrate.

However, in the semiconductor physical quantity sensor described in JP-A-2010-8126, it is not considered how to determine whether or not the mass portion is in a state of being stuck to the fixed electrode.

SUMMARY

A physical quantity sensor includes a physical quantity detection element coupled to a first terminal, a second terminal, and a third terminal, and a physical quantity detection circuit. The physical quantity detection circuit has a drive circuit that drives the physical quantity detection element, a signal generation circuit that generates a physical quantity signal corresponding to a magnitude of a physical quantity based on a detection signal output from the physical quantity detection element, a determination circuit that determines whether a value of the physical quantity signal continuously remains within a predetermined range in a predetermined period, determines that the physical quantity detection element is in a first state of normal operation when the value does not continuously remain, and determines that the physical quantity detection element is in a second state of abnormal operation when the value continuously remains, a control circuit that stores the physical quantity signal and setting information, and a communication section that outputs the physical quantity signal to an outside. the control circuit stores first information based on a determination result of the determination circuit as the setting information, and the communication section outputs the setting information stored in the control circuit to the outside when the determination result of the determination circuit indicates the second state.

An inertial measurement unit includes the physical quantity sensor described above and a controller that performs control based on a physical quantity signal output from the physical quantity sensor.

DESCRIPTION OF EXEMPLARY EMBODIMENTS

Hereinafter, the present embodiment will be described. The present embodiment described below does not unreasonably limit the description of the appended claims. Moreover, all of the elements described in the present embodiment should not necessarily be taken as essential elements.

Figure 1:
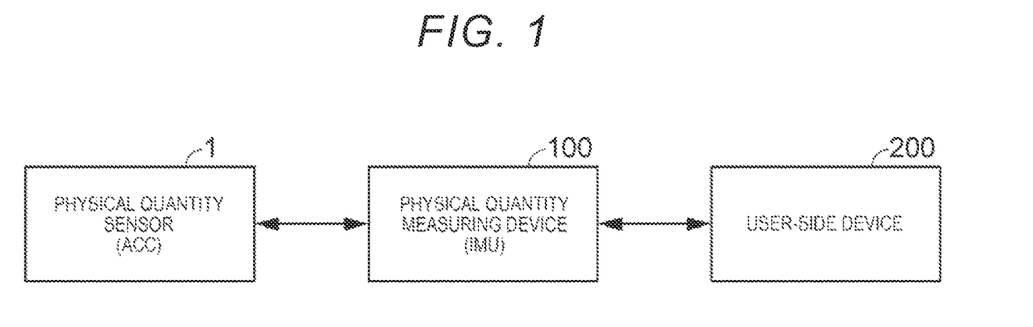
FIG. 1 is a block diagram showing a relationship between a physical quantity sensor, a physical quantity measuring device, and a user-side device according to an embodiment.

1. Physical Quantity Sensor, Physical Quantity Measuring Device, and User-Side Device FIG. 1 shows a relationship between a physical quantity sensor 1, for example, an acceleration sensor (ACC), a physical quantity measuring device 100, for example, an inertial measurement unit (IMU), and a user-side device 200. The physical quantity sensor 1 is coupled to the physical quantity measuring device 100, and the physical quantity measuring device 100 is coupled to the user-side device 200. The physical quantity sensor 1 and the physical quantity measuring device 100 may be mounted on the user-side device 200. In the present embodiment, the physical quantity sensor 1 has a determination function for determining whether a value of a physical quantity signal continuously remains within a predetermined range in a predetermined period, determining that a detection element is in a first state of normal operation when the value does not continuously remain, and determining that the detection element is in a second state of abnormal operation when the value continuously remains. Therefore, it is possible to detect the operation abnormality of the detection element and take effective countermeasures. Further, in the second state in which the operation of the detection element is abnormal, setting information of the element abnormality can be called from the physical quantity sensor 1 to the user-side device 200. In this way, the detection element can be restored to normal by receiving, from the user-side device 200, a bias application function command to restore the detection element to normal, applying a bias voltage to the detection element of an abnormal operation, and performing a self-test to see if the detection element operates normally. Therefore, it is possible to obtain the physical quantity sensor 1 capable of determining the abnormality of the detection element and restoring the detection element of the abnormal operation to the normal operation without forming a new electrode or the like on the detection element.

2. Physical Quantity Sensor 2.1. Element Section

Figure 2:
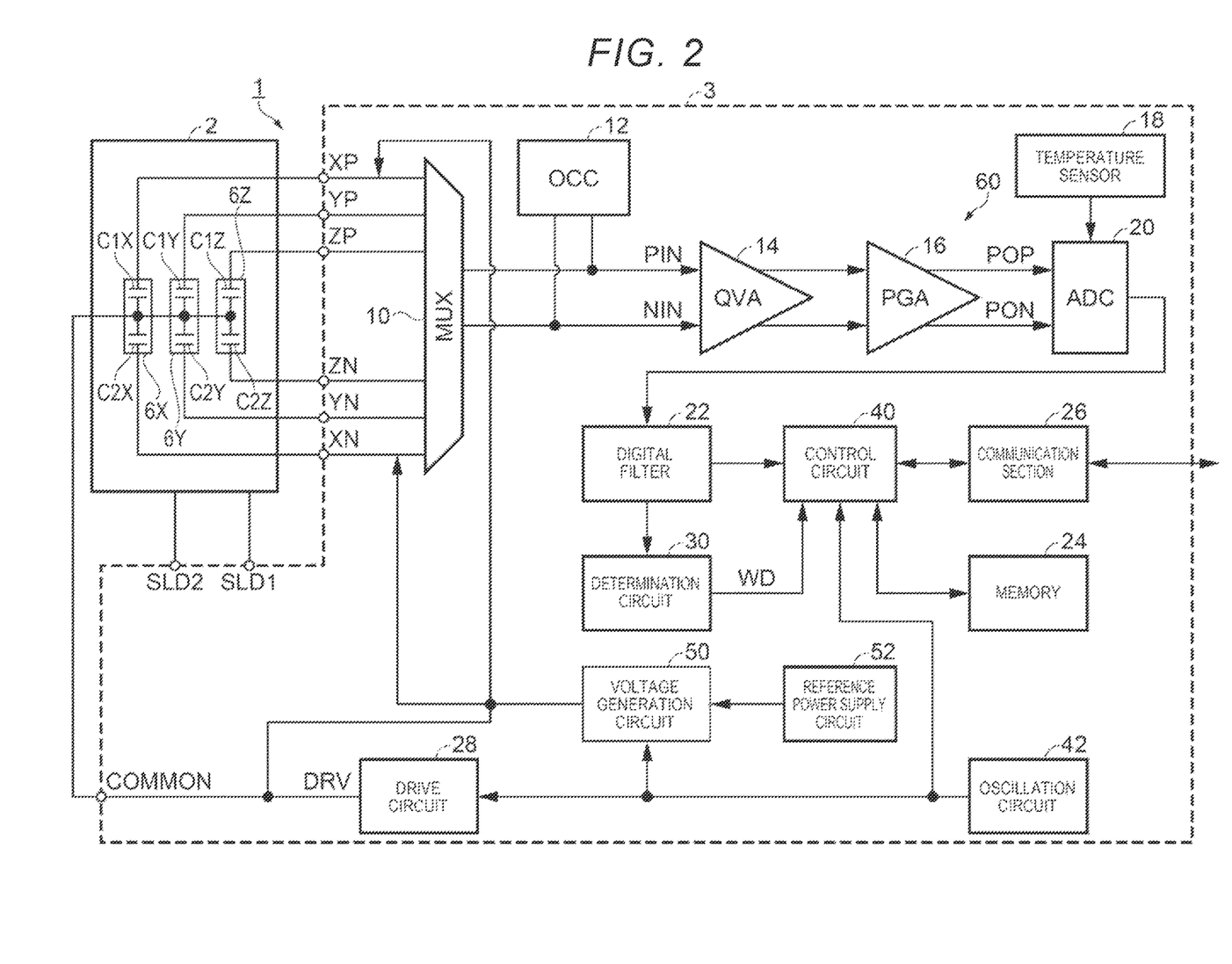
FIG. 2 is a block diagram of the physical quantity sensor according to the embodiment.

FIG. 2 is a diagram showing a functional configuration of the physical quantity sensor 1 of the present embodiment. The physical quantity sensor 1 of the present embodiment includes an element section 2 and a physical quantity detection circuit 3. First, the element section 2 will be described. The element section 2 detects physical quantities of three axes, an X-axis, a Y-axis, and a Z-axis, which are orthogonal to each other, for example, acceleration a. As shown in FIG. 2, the element section 2 includes a physical quantity detection element 6X that outputs a detection signal depending on the acceleration a applied in an X-axis direction, a physical quantity detection element 6Y that outputs a detection signal depending on the acceleration a applied in a Y-axis direction, and a physical quantity detection element 6Z that outputs a detection signal depending on the acceleration a applied in a Z-axis direction. The detection axes of the physical quantity detection elements 6X, 6Y, and 6Z are defined as the X-axis, the Y-axis, and the Z-axis.

In the present embodiment, the physical quantity detection elements 6X, 6Y, and 6Z include each a fixed portion provided with a first fixed electrode and a second fixed electrode, and a movable electrode which is a movable portion. The first fixed electrodes and the movable electrodes face each other, which make first capacitance forming portions C1X, C1Y, and C1Z. Similarly, the second fixed electrodes and the movable electrodes face each other, which make second capacitance forming portions C2X, C2Y, and C2Z. The physical quantity detection element 6X includes the first capacitance forming portion C1X and the second capacitance forming portion C2X, and the physical quantity detection element 6Y includes the first capacitance forming portion C1Y and the second capacitance forming portion C2Y, and the physical quantity detection element 6Z includes the first capacitance forming portion C1Z and the second capacitance forming portion C2Z.

When the acceleration a in a detection axis direction is applied, a force F of F=m×a acts on the movable portion having the mass m. Due to the force F, the movable portion is displaced relative to the fixed portion. In this case, in the direction of the acceleration a, the capacitance values of the first capacitance forming portions C1X, C1Y, and C1Z decrease and the capacitance values of the second capacitance forming portions C2X, C2Y, and C2Z increase, or the capacitance values of the first capacitance forming portions increase and the capacitance values of the second capacitance forming portions decrease. Therefore, when the acceleration a acts on the physical quantity detection elements 6X, 6Y, and 6Z in a state in which the electric charges are supplied to the common end of the first capacitance forming portions C1X, C1Y, and C1Z and the second capacitance forming portions C2X, C2Y, and C2Z, the electric charges that are the signals output from one end of the first capacitance forming portions C1X, C1Y, and C1Z and one end of the second capacitance forming portions C2X, C2Y, and C2Z, respectively, are differential signal pairs having the same absolute value and opposite signs. Equal absolute values include substantially equal absolute values, in addition to equal absolute values. That is, it means including a case where one electric charge deviates slightly from the other electric charge by, for example, about 10% or less, in consideration of errors that may occur in manufacturing. The physical quantity detection circuit 3 generates three axes physical quantity signals of an X-axis acceleration signal, a Y-axis acceleration signal, and a Z-axis acceleration signal by using the differential signal pairs output from the physical quantity detection elements 6X, 6Y, and 6Z as detection signals, respectively.

The physical quantity detection elements 6X, 6Y, and 6Z are all differential capacitance type sensors, and are formed of, for example, a semiconductor material such as silicon (Si) and micro electro mechanical systems (MEMS) using semiconductor processing technology.

2.2. Physical Quantity Detection Circuit

As shown in FIG. 2, in the physical quantity detection element 6X, the common end of the first capacitance forming portion C1X and the second capacitance forming portion C2X is electrically coupled to a first terminal COMMON, one end of the first capacitance forming portion C1X is electrically coupled to a second terminal XP, and one end of the second capacitance forming portion C2X is electrically coupled to a third terminal XN. Similarly, in the physical quantity detection element 6Y, the common end of the first capacitance forming portion C1Y and the second capacitance forming portion C2Y is electrically coupled to the first terminal COMMON, one end of the first capacitance forming portion C1Y is electrically coupled to a second terminal YP, and one end of the second capacitance forming portion C2Y is electrically coupled to a third terminal YN. Similarly, in the physical quantity detection element 6Z, the common end of the first capacitance forming portion C1Z and the second capacitance forming portion C2Z is electrically coupled to the first terminal COMMON, one end of the first capacitance forming portion C1Z is electrically coupled to a second terminal ZP, and one end of the second capacitance forming portion C2Z is electrically coupled to a third terminal ZN.

A ground pattern for shielding (not shown) is provided in the element section 2, and a shield voltage, for example, 0 V is supplied to each ground pattern via shield terminals SLD1 and SLD2 of the physical quantity detection circuit 3.

As shown in FIG. 2, the physical quantity detection circuit 3 includes a multiplexer (MUX) 10, an offset control capacitor (OCC) 12, a Q/V amplifier (QVA) 14, a programmable gain amplifier (PGA) 16, a temperature sensor 18, A/D conversion circuit (ADC) 20, a digital filter 22, a memory 24, a communication section 26, a drive circuit 28, a determination circuit 30, a control circuit 40, an oscillation circuit 42, a voltage generation circuit 50, and a reference power supply circuit 52.

The multiplexer 10 output a differential signal pair PIN and NIN by selecting one of a differential signal pair input from the terminals XP and XN, a differential signal pair input from the terminals YP and YN, and a differential signal pair input from the terminals ZP and ZN based on clock signals that are exclusively active with each other.

The offset control capacitor 12 is coupled to output lines of the differential signal pair of the multiplexer 10, and adjusts 0 points for each of the X-axis, Y-axis, and Z-axis of the first capacitance and the second capacitance.

The Q/V amplifier 14 converts the electric charge differential signal pair PIN and NIN output from the multiplexer 10 into a voltage differential signal pair and outputs the voltage differential signal pair. The programmable gain amplifier 16 receives the differential signal pair which are differential voltage signals output from the Q/V amplifier 14, and outputs a differential signal pair POP and PON which are obtained by amplifying the corresponding differential signals. The A/D conversion circuit 20 samples the differential signal pairs output by the programmable gain amplifier 16 based on the clock signal, and converts the potential difference between the differential signal pairs into a digital signal. Further, the A/D conversion circuit 20 can correct the bias that drifts depending on temperature, based on the temperature detected by the temperature sensor 18.

The digital filter 22 performs a filtering process on the digital signal output from the A/D conversion circuit 20. Since the high-frequency noise generated by the A/D conversion process of the A/D conversion circuit 20 is superimposed on the digital signal output from the A/D conversion circuit 20, the digital filter 22 functions as a low-pass filter that reduces the high-frequency noise. The digital filter 22 can also function as a high-pass filter, if necessary.

Therefore, the circuit including the multiplexer 10, the Q/V amplifier 14, the programmable gain amplifier 16, the A/D conversion circuit 20, and the digital filter 22 functions as a signal generation circuit 60. Therefore, the signal generation circuit 60 generates the three axes physical quantity signals of the X-axis acceleration signal, the Y-axis acceleration signal, and the Z-axis acceleration signal corresponding to the magnitude of the acceleration a detected for the X-axis, the Y-axis, and the Z-axis, based on the differential signal pairs of the three axes output from the physical quantity detection elements 6X, 6Y, and 6Z for detecting the acceleration a for the X-axis, Y-axis, and Z-axis, which are three axes different from each other.

The memory 24 stores data necessary for the operation of the physical quantity detection circuit 3, data such as setting information, and data output from the control circuit 40, or the like. The communication section 26 is a serial interface circuit for communicating with the physical quantity measuring device 100 shown in FIG. 1. The physical quantity measuring device 100 can write and read data to and from the memory 24 through the control circuit 40. Therefore, the physical quantity signals corresponding to the acceleration a for the X-axis, the Y-axis, and the Z-axis based on the differential signal pairs of the X-axis, the Y-axis, and the Z-axis is output to the physical quantity measuring device 100 via the communication section 26. The communication section 26 may be, for example, a 3-terminal or 4-terminal serial peripheral interface (SPI) interface circuit, may be a 2-terminal inter-integrated circuit (I2C) interface circuit, or may be switchable between both.

The drive circuit 28 generates a drive signal DRV for driving the physical quantity detection elements 6X, 6Y, and 6Z based on the clock signal output by the oscillation circuit 42, and the drive signal DRV is commonly applied to the physical quantity detection elements 6X, 6Y, and 6Z through the first terminal COMMON of the physical quantity detection circuit 3. The voltage of the drive signal DRV periodically changes in an order of VCOM, which is a first voltage V1 as a reference voltage, for example, VDD/2, VDD, which is a second voltage V2 as a power supply voltage, and VSS, which is a third voltage V3, for example, 0 V based on the clock signal, and is applied to the physical quantity detection elements 6X, 6Y, and 6Z, respectively. The power supply voltage VDD is generated by the reference power supply circuit 52 and input to the voltage generation circuit 50.

The determination circuit 30 determine the abnormality of the physical quantity detection elements 6X, 6Y, and 6Z based on the values of the three axes physical quantity signals of the X-axis acceleration signal, the Y-axis acceleration signal, and the Z-axis acceleration signal output from the digital filter 22 or the amount of change in the values. The determination circuit 30 has a determination function for determining whether values of the physical quantity signals continuously remain within a predetermined range in a predetermined period, determining that the physical quantity detection elements 6X, 6Y, and 6Z are in a first state of normal operation when the values do not continuously remain, and determining that the physical quantity detection elements 6X, 6Y, and 6Z are in a second state of abnormal operation when the values continuously remain.

Figure 3:
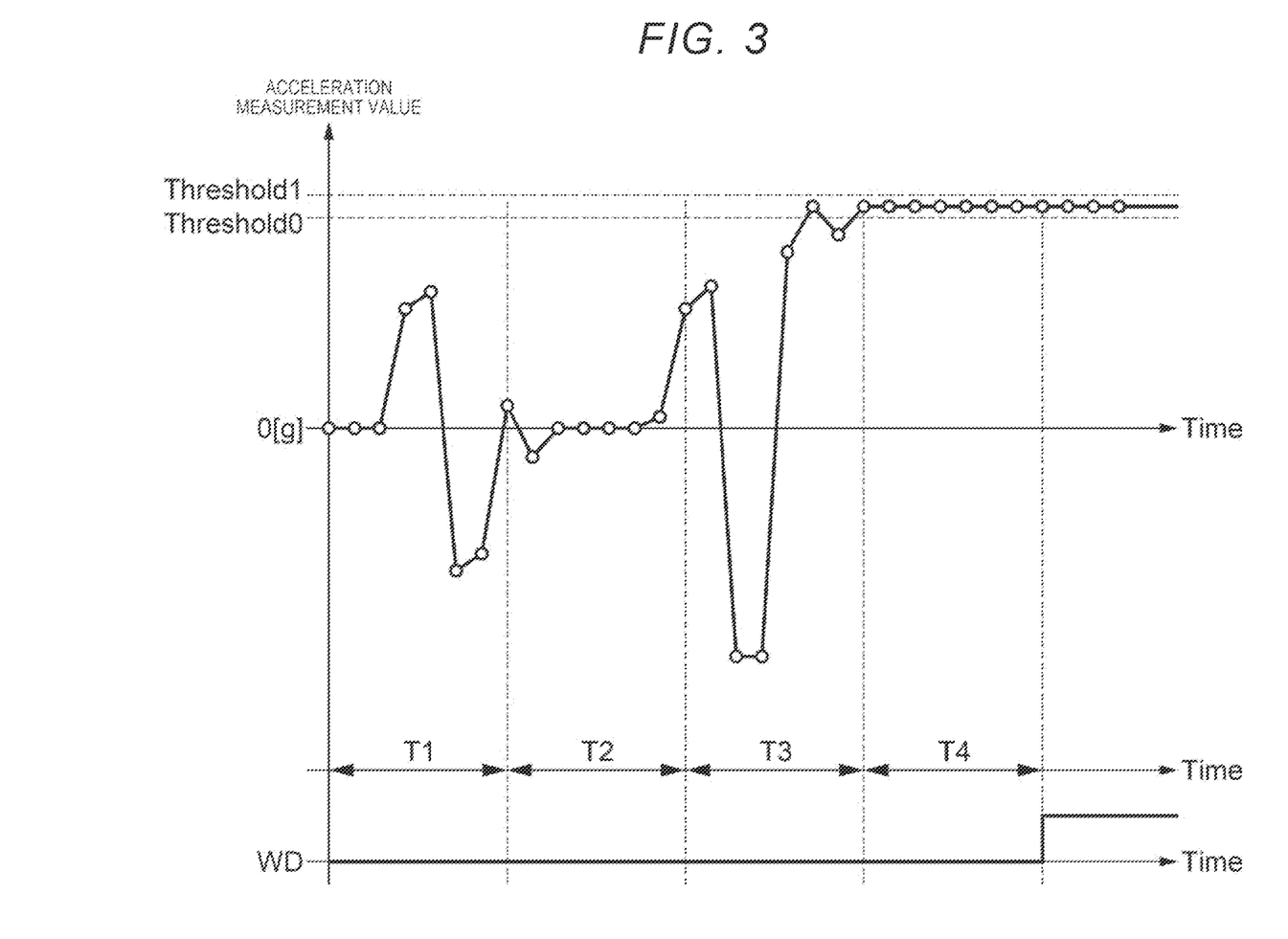
FIG. 3 is a characteristic diagram for determining an abnormality of an element.

Specifically, when one physical quantity signal in the three physical quantity detection elements 6X, 6Y, and 6Z has the characteristics shown in FIG. 3, during periods T1 to T3, the acceleration measurement value, which is the value of the physical quantity signal, is not continuously between Threshold0 and Threshold1 which are in a predetermined range, and thus the determination circuit 30 determines that the physical quantity detection elements 6X, 6Y, and 6Z are in the first state of normal operation. Further, in a period T4, the acceleration measurement value, which is the value of the physical quantity signal, is continuously between Threshold0 and Threshold1 which are in the predetermined range, and thus the determination circuit 30 determines that the physical quantity detection elements 6X, 6Y, and 6Z are in a second state of abnormal operation.

When the determination result indicates the second state in which the operation of the physical quantity detection elements 6X, 6Y, and 6Z is abnormal, the determination circuit 30 outputs first information indicating the second state of element abnormality where a determination signal WD is active. The first information based on the determination result output from the determination circuit 30 is stored in the control circuit as setting information. Specifically, the first information is stored in a register in the control circuit 40. When the determination result of the determination circuit 30 indicates the second state, the setting information stored in the control circuit 40 is output from the communication section 26 to an external device, for example, the physical quantity measuring device 100. In the present embodiment, the predetermined range is set by the maximum value of the acceleration measurement values, that is, the state in which the movable electrode is stuck to the first fixed electrode or the second fixed electrode is defined as the second state in which the operation of the physical quantity detection elements 6X, 6Y, and 6Z is abnormal.

Figure 4:
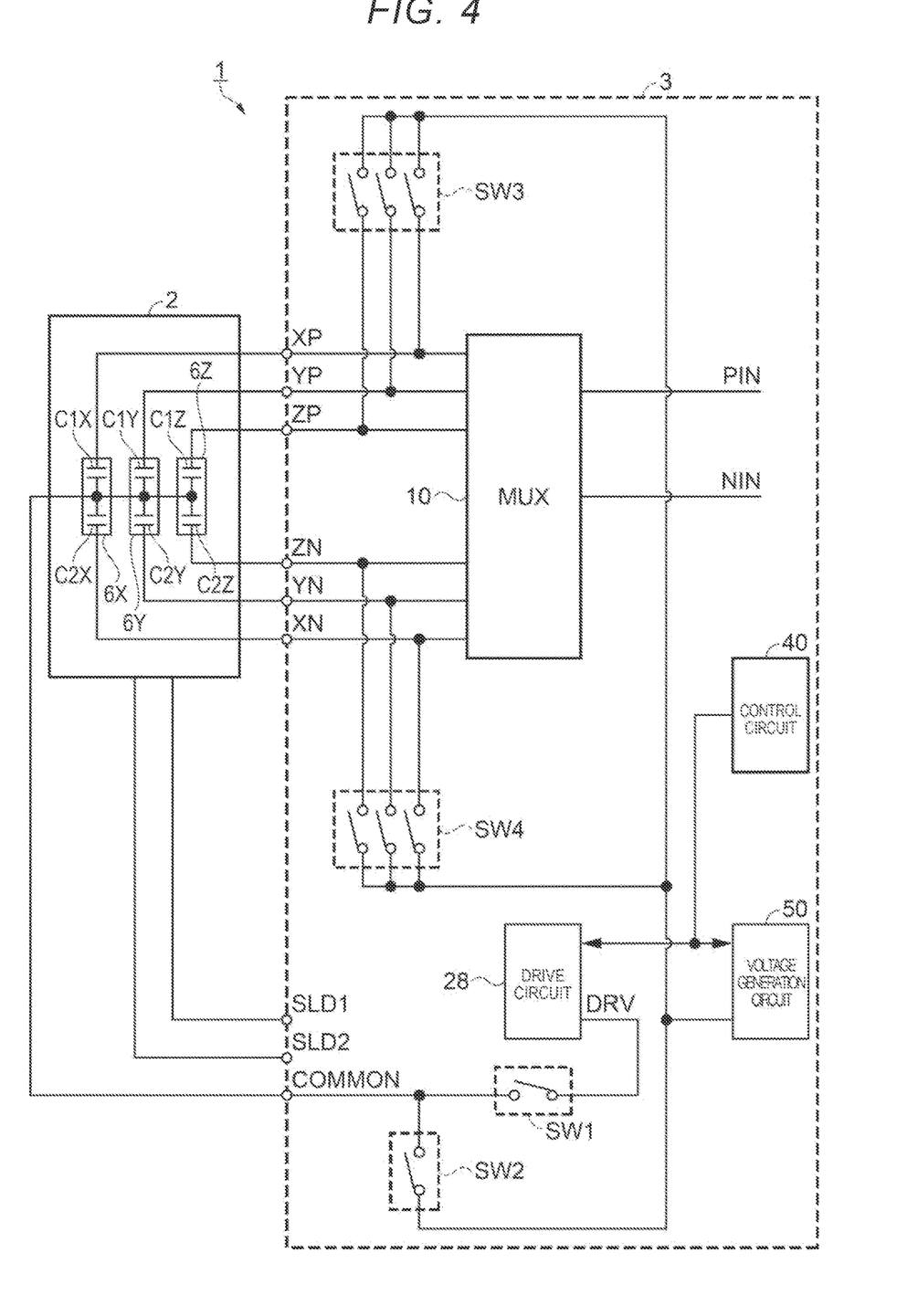
FIG. 4 is a circuit diagram illustrating the function of a control circuit of FIG. 2.

When the communication section 26 receives, from the outside, second information indicating the first state of element normality, the control circuit 40 controls switching circuits SW1, SW2, SW3, and SW4, as shown in FIG. 4 based on the second information, which is the setting information, stored in the control circuit 40 to put the physical quantity detection elements 6X, 6Y, and 6Z and the drive circuit 28 into a coupled state and to put the physical quantity detection elements 6X, 6Y, and 6Z and the voltage generation circuit 50 in a decoupled state. Then, the control circuit 40 controls the drive circuit 28 based on the second information to repeatedly apply the first voltage V1

(VCOM), the second voltage V2 (VDD), and the third voltage V3 (VSS) to the physical quantity detection elements 6X, 6Y, and 6Z from the first terminal COMMON in this order. The first voltage V1, the second voltage V2, and the third voltage V3 are repeatedly applied to the physical quantity detection element 6X, the physical quantity detection element 6Y, and the physical quantity detection element 6Z, in this order. As a result, the signal generation circuit can generate the physical quantity signals of the physical quantity detection elements 6X, 6Y, and 6Z in the first state in which the operation of the elements are normal.

Further, when the communication section 26 receives, from the outside, the second information which is a bias voltage application function command associated with the second state of the element abnormality and the control circuit 40 stores the second information, the control circuit 40 controls switching circuits SW1, SW2, SW3, and SW4 shown in FIG. 4 based on the second information, which is the setting information, to put the physical quantity detection elements 6X, 6Y, and 6Z and the drive circuit 28 into a decoupled state such that the driving of the physical quantity detection elements 6X, 6Y, and 6Z is stopped, and to put the physical quantity detection elements 6X, 6Y, and 6Z and the voltage generation circuit 50 into a coupled state. Then, the control circuit 40 controls the voltage generation circuit 50 based on the second information such that the fourth voltage V4 is applied to the first terminal COMMON of the physical quantity detection elements 6X, 6Y, and 6Z, the fifth voltage V5 is applied to the second terminals XP, YP, and ZP, and the sixth voltage V6 is applied to the third terminals XN, YN, and ZN. In this way, by applying the fourth voltage V4, the fifth voltage V5, and the sixth voltage V6, which are the bias voltages, to respective terminals, it is possible to return from the second state, in which the movable electrode and the first fixed electrode or the second fixed electrode are stuck, to the first state, in which the sticking is released and the normal operation is performed.

Figure 5:
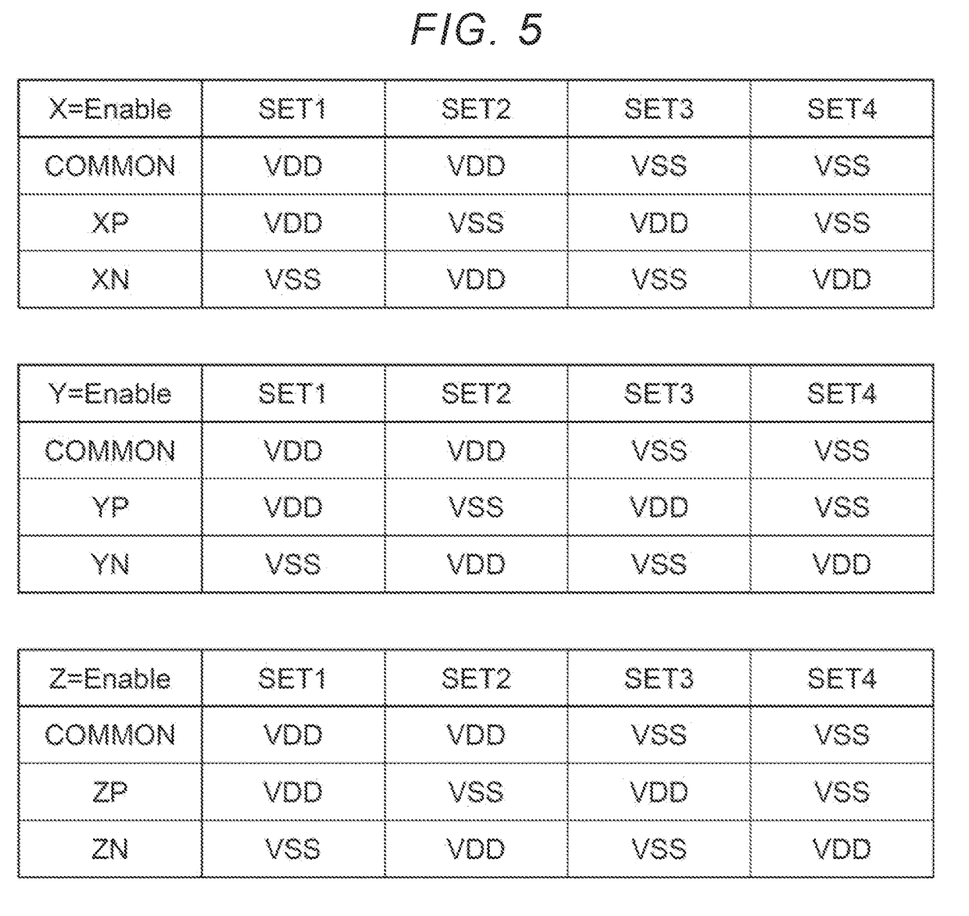
FIG. 5 is a diagram showing a setting of a bias voltage application function.

As shown in FIG. 5, the fourth voltage V4, the fifth voltage V5, and the sixth voltage V6 applied to respective terminals have four combinations of SET1 to SET4. For example, in a case of an operation abnormality in which the movable electrode and the first fixed electrode or the second fixed electrode of the physical quantity detection element 6X are stuck to each other, as a first combination of SET1, a voltage of VDD is applied to the first terminal COMMON and the second terminal XP as the fourth voltage V4 and fifth voltage V5 of VDD and a voltage of VSS is applied to the third terminal XN as the sixth voltage V6. When the sticking is not released by the combination of SET1, a combination of SET2 is applied, and if the sticking is not released by the combination of SET2, a combination of SET3 is applied. Further, when the sticking is not released, a combination of SET4 is applied. When the physical quantity detection elements 6Y and 6Z also have the operation abnormality due to sticking, by performing the same operation, it is possible to return to the first state in which the sticking is released and the normal operation is performed.

Figure 6:
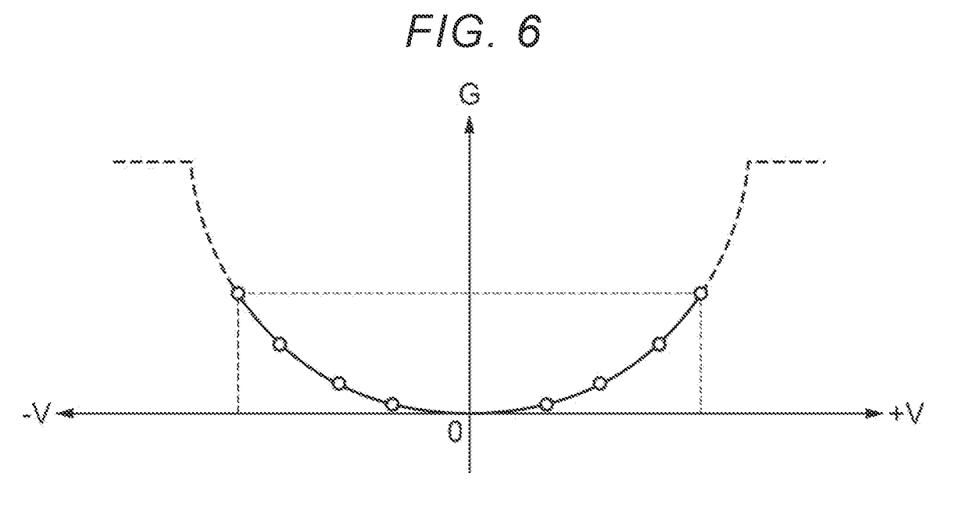
FIG. 6 is a characteristic diagram when an element is normal.

Further, when the fourth voltage V4, the fifth voltage V5, and the sixth voltage V6, which are the bias voltages, are applied to respective terminals and then the sticking is released, when the communication section 26 receives, from the outside, third information for self-testing whether an element is normally operating and the control circuit 40 stores the third information, the control circuit 40 controls the switching circuits SW1, SW2, SW3, and SW4 shown in FIG. 4 based on the third information, which is the setting information, to put the physical quantity detection elements 6X, 6Y, and 6Z and the drive circuit 28 into a coupled state and to put the physical quantity detection elements 6X, 6Y, and 6Z and the voltage generation circuit 50 into a decoupled state. The control circuit 40 applies a seventh voltage V7 from the first terminal COMMON to the physical quantity detection elements 6X, 6Y, and 6Z of which operations are abnormal in a state in which the physical quantity sensor 1 is stopped, that is, in a state in which the acceleration a is not applied to the physical quantity detection elements 6X, 6Y, and 6Z. C0 values measured by the physical quantity detection elements 6X, 6Y, and 6Z for the applied seventh voltage V7 are converted into an acceleration value G, which is a physical quantity signal, and transmitted from the communication section 26 to the outside. When the communication section 26 receives fourth information which is the determination result of the physical quantity detection elements 6X, 6Y, and 6Z from the outside, the fourth information is stored in the control circuit 40. The fourth information is a determination result obtained by, as shown in FIG. 6, a user determining whether or not the acceleration value G into which the C0 values for the applied voltage are converted matches a G-V curve of the normally operating element.

Figure 7:
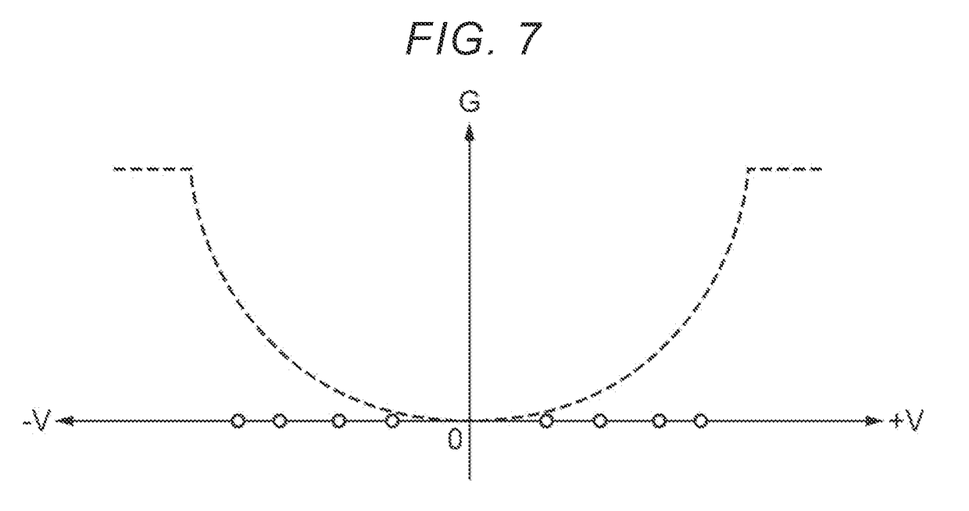
FIG. 7 is a characteristic diagram when an element is abnormal.
Figure 8:
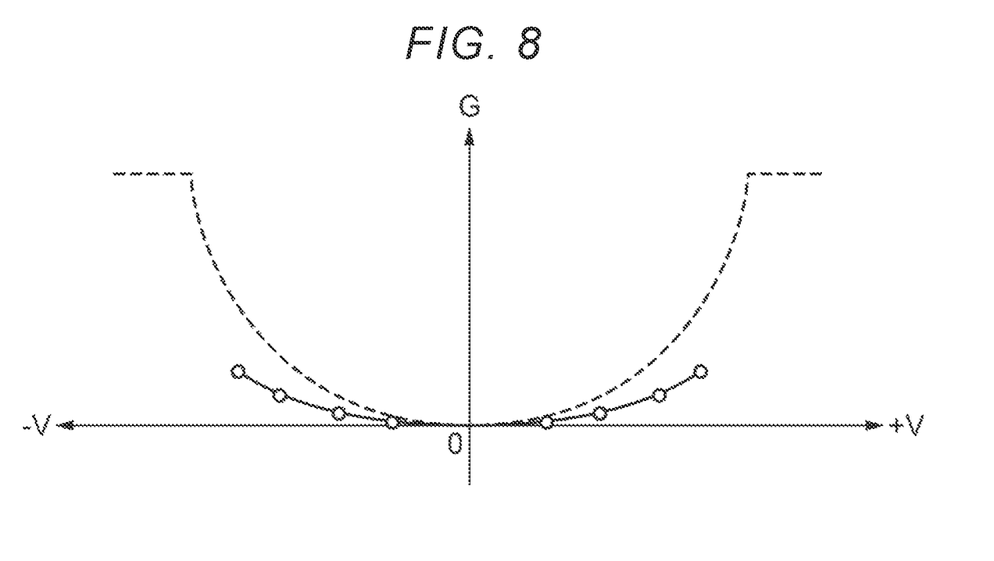
FIG. 8 is a characteristic diagram when an element is abnormal.

When the fourth information, which is the setting information, is a determination result indicating that the physical quantity detection elements 6X, 6Y, and 6Z are not out of order, the control circuit 40 controls the switching circuits SW1, SW2, SW3, and SW4 to put the physical quantity detection elements 6X, 6Y, and 6Z and the drive circuit 28 into a coupled state and to put the physical quantity detection elements 6X, 6Y, and 6Z and the voltage generation circuit 50 into a decoupled state, and controls the drive circuit 28 based on the fourth information to drive the physical quantity detection elements 6X, 6Y, and 6Z repeatedly applying the first voltage V1, the second voltage V2, and the third voltage V3 in this order from the first terminal COMMON, respectively, and to generate the physical quantity signals of the physical quantity detection elements 6X, 6Y, and 6Z by the signal generation circuit 60. Further, when the fourth information, which is the setting information, is a determination result indicating that the physical quantity detection elements 6X, 6Y, and 6Z are out of order, the control circuit 40 stops the physical quantity sensor 1, and it is to be noted that FIG. 6 is a G-V curve of an element operating normally by applying a bias voltage and releasing the sticking, whereas FIG. 7 is a G-V curve when an element is completely damaged, and FIG. 8 is a G-V curve when an element is damaged such as a crack or a chip.

The oscillation circuit 42 outputs a clock signal. For example, it may be a CR oscillator, a ring oscillator, or the like.

The voltage generation circuit 50 generates a fourth voltage V4, a fifth voltage V5, and a sixth voltage V6 set by the control circuit 40 based on the second information. At least one of the fourth voltage V4, the fifth voltage V5, and the sixth voltage V6 is a voltage obtained by boosting the second voltage V2 (VDD), which is the power supply voltage. The fourth voltage V4 is applied to the first terminal COMMON of the physical quantity detection elements 6X, 6Y, and 6Z, the fifth voltage V5 is applied to the second terminals XP, YP, and ZP, and the sixth voltage V6 is applied to the third terminals XN, YN, and ZN, and thus it is possible to release the state in which the movable electrodes and the first fixed electrodes or the second fixed electrodes of the physical quantity detection elements 6X, 6Y, and 6Z are stuck to each other.

Further, the voltage generation circuit 50 generates a seventh voltage V7 set by the control circuit 40 based on the third information. The seventh voltage V7 is applied to the physical quantity detection elements 6X, 6Y, and 6Z of which the operation is abnormal, and the determination is made as to whether or not the physical quantity detection elements 6X, 6Y, and 6Z are out of order by the acceleration value G of the physical quantity detection elements 6X, 6Y, and 6Z for the applied seventh voltage V7, based on whether the acceleration value G for the applied voltage matches the G-V curve of the element that is normally operating.

The reference power supply circuit 52 generates VDD, which is the power supply voltage, and outputs VDD to the voltage generation circuit 50.

3. Overall Operation

Next, with reference to FIG. 9, the overall operation of the physical quantity sensor (ACC) 1, the physical quantity measuring device (IMU) 100, and the user-side device 200 will be described.

Figure 9:
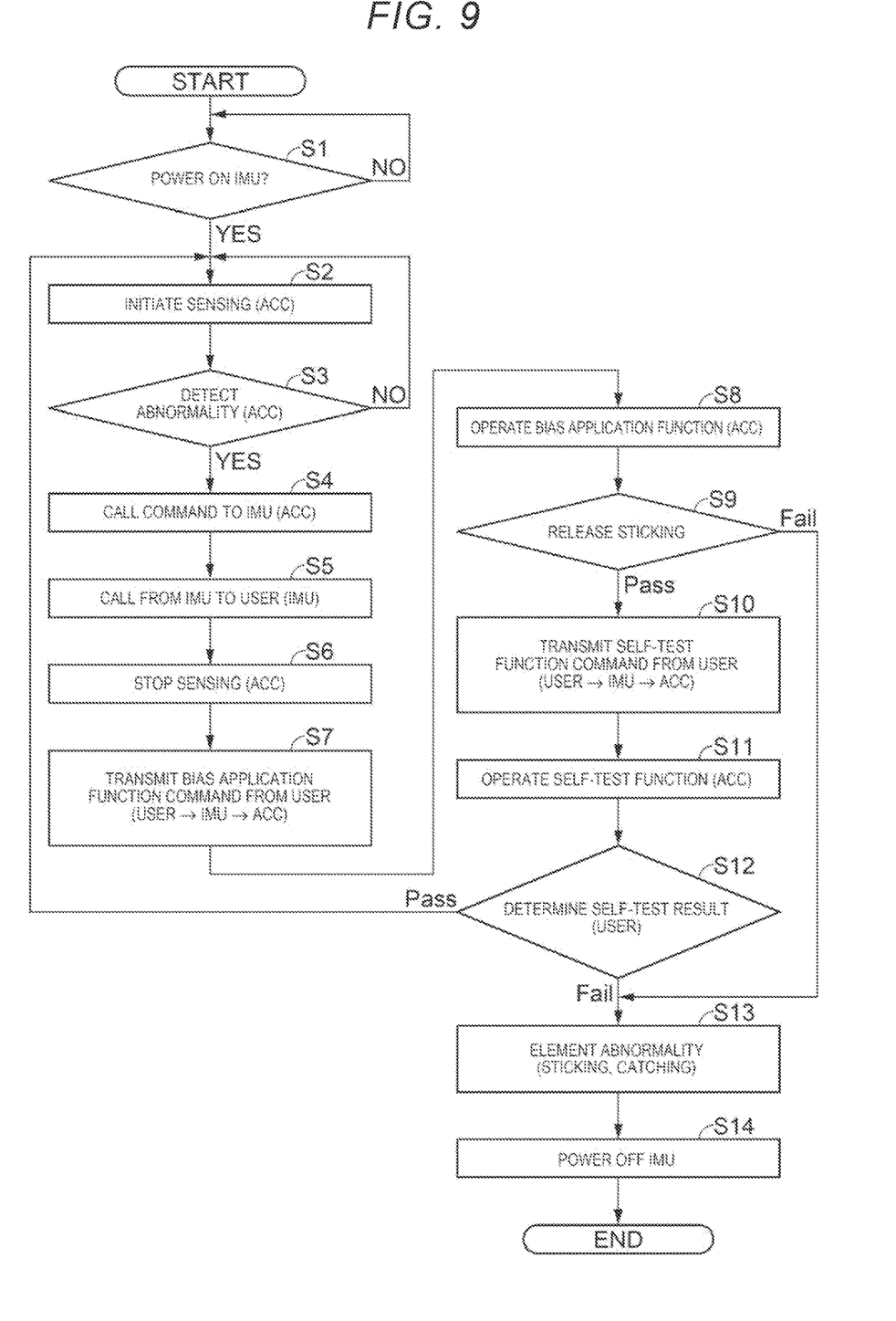
FIG. 9 is a flowchart showing operations of a physical quantity sensor, a physical quantity measuring device, and a user-side device according to the embodiment.

First, when the physical quantity measuring device (IMU) 100 is powered on in step S1 shown in FIG. 9, sensing is initiated by the physical quantity sensor (ACC) 1 in step S2. In the sensing, corresponding to the periods T1 to T3 in FIG. 3, the physical quantity detection elements 6X, 6Y, and 6Z are driven, and the physical quantity signals of the X-axis, the Y-axis, and the Z-axis are collected.

Next, in step S3, the determination circuit 30 determines whether the values of the collected physical quantity signals continuously remain within a predetermined range in a predetermined period corresponding to period T4 of FIG. 3, and when it is determined that the physical quantity detection elements 6X, 6Y, and 6Z are in the second state of which the operation is abnormal when the values continuously remain, the first information indicating element abnormality is stored in the control circuit 40 as the setting information. Further, when the first state in which the operation of the physical quantity detection elements 6X, 6Y, and 6Z is normal is determined by the values of the physical quantity signals, the sensing operation of step S2 continues to be repeated.

Next, in step S4, the first information is called to the physical quantity measuring device (IMU) 100 through the control circuit 40 and the communication section 26. Then, in step S5, the first information is called from the physical quantity measuring device (IMU) 100 to the user-side device 200.

Next, in step S6, when the first information stored in the control circuit 40 is confirmed, the control circuit 40 controls the switching circuit SW1 such that the physical quantity detection elements 6X, 6Y, and 6Z and the drive circuit 28 are decoupled from each other and the sensing of the physical quantity sensor (ACC) 1 is stopped.

Next, in step S7, the second information, which is a bias voltage application function command associated with the second state of element abnormality, is transmitted from the user of the user-side device 200. In step S8, the second information transmitted from the user-side device 200 through the physical quantity measuring device 100 is received by the communication section 26 and stored in the control circuit 40, and then based on the second information, which is the setting information, the fourth voltage V4 is applied to the first terminal COMMON of the physical quantity detection elements 6X, 6Y, and 6Z where the operation of the elements is abnormal, the fifth voltage V5 is applied to the second terminals XP, YP, and ZP, and the sixth voltage V6 is applied to the third terminals XN, YN, and ZN.

Next, in step S9, when the sticking of the physical quantity detection elements 6X, 6Y, and 6Z of which operation is abnormal is not released, the process proceeds to step S13, and a determination is made that the elements are abnormal, and in step S14, the physical quantity sensor 1 is stopped, the physical quantity measuring device 100 is powered off, and all operations are completed.

Further, when the sticking of the physical quantity detection elements 6X, 6Y, and 6Z of which operation is abnormal is released, the process proceeds to step S10, and the third information, which is a self-test function command to test whether the elements are normally operation is transmitted from the user. In step S11, the third information transmitted from the user-side device 200 through the physical quantity measuring device 100 is received by the communication section 26 and stored in the control circuit 40, and then based on the third information, which is the setting information, the seventh voltage V7 is applied from the first terminal COMMON to the physical quantity detection elements 6X, 6Y, and 6Z of which the operation is abnormal.

Next, in step S12, the physical quantity signals obtained by converting the measured C0 values of the physical quantity detection elements 6X, 6Y, and 6Z for the applied seventh voltage V7 into the acceleration value G are transmitted to the user, and the user determines whether the acceleration value G into which the C0 values for the applied voltage is converted matches the G-V curve of the element that is normally operating. When the fourth information, which is the determination result of the physical quantity detection elements 6X, 6Y, and 6Z, is received from the user, the process proceeds to step S2 and the sensing operation is initiated when the fourth information, which is the setting information, is the determination result indicating that the physical quantity detection elements 6X, 6Y, and 6Z are not out of order.

In addition, when the fourth information, which is the setting information, is the determination result indicating that the physical quantity detection elements 6X, 6Y, and 6Z are out of order, the process proceeds to step S13 to determine that the elements are abnormal, and in step S14, the physical quantity sensor 1 is stopped, the physical quantity measuring device 100 is powered off, and all operations are completed.

As described above, the physical quantity sensor 1 of the present embodiment can determine whether the values of the physical quantity signals continuously remain within a predetermined range in a predetermined period, determine that the physical quantity detection elements 6X, 6Y, and 6Z are in the first state of normal operation when the values do not continuously remain, and determine that the physical quantity detection elements 6X, 6Y, and 6Z are in the second state in which the movable electrode and the first fixed electrode or the second fixed electrode are stuck when the values continuously remains. Therefore, it is possible to detect the sticking between the movable electrode and the fixed electrode and take effective countermeasures. Further, in the second state in which the operation of the physical quantity detection elements 6X, 6Y, and 6Z is abnormal, the first information of the element abnormality can be called from the physical quantity sensor 1 to the user-side device 200 through the physical quantity measuring device 100. As a result, it is possible to receive, from the user-side device 200, the second information, which is a bias application function command for restoring the physical quantity detection elements 6X, 6Y, and 6Z, to normal, and to release the sticking by applying the fourth voltage V4, the fifth voltage V5, and the sixth voltage V6, which are the bias voltages, to the physical quantity detection elements 6X, 6Y, and 6Z in the second state.

Further, the sticking is released by applying the bias voltage, the third information is received from the user, which is the self-test function command to determine whether the physical quantity detection elements 6X, 6Y, and 6Z, which have been in the second state, operate normally, the seventh voltage V7 is applied to the physical quantity detection elements 6X, 6Y, and 6Z to which the bias voltage has been applied in the state in which the physical quantity sensor 1 is stopped, and the determination is made as to whether the acceleration value G into which the C0 values for the applied seventh voltage is converted matches the G-V curve of the element that is normally operating, and in this way, it is possible to release the sticking of the physical quantity detection elements 6X, 6Y, and 6Z, which have been in the second state, and determine whether the physical quantity detection elements operate normally.

Therefore, it is possible to obtain the physical quantity sensor 1 that can restore the physical quantity detection elements to the normal operation state by detecting the physical quantity detection elements 6X, 6Y, and 6Z in which the movable electrode and the first fixed electrode or the second fixed electrode are stuck without forming a new electrode or the like in the element section 2, and releasing the sticking by applying the bias voltage.

4. Inertial Measurement Unit

Next, an inertial measurement unit 2000 including the physical quantity sensor 1 according to the present embodiment will be described with reference to FIGS. 10 and 11. For convenience of description, the X-axis, the Y-axis, and the Z-axis are shown in each figure as three axes orthogonal to each other.

Figure 10:
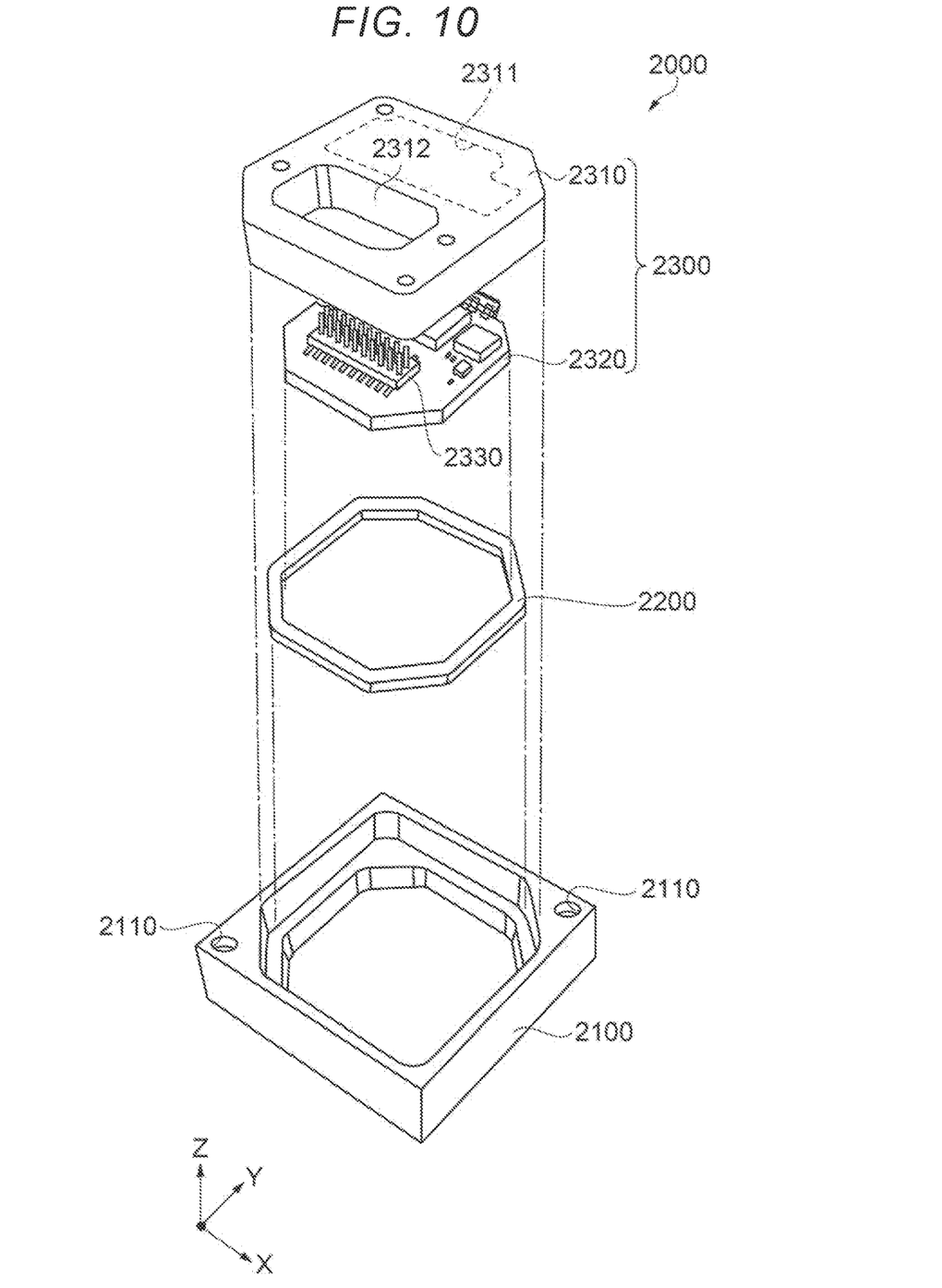
FIG. 10 is an exploded perspective view showing a schematic configuration of an inertial measurement unit including the physical quantity sensor according to the embodiment.

The inertial measurement unit 2000 (IMU) shown in FIG. 10 is a device that detects the posture and the amount of inertial momentum, such as the behavior, of a moving body, such as an automobile or a robot. The inertial measurement unit 2000 functions as a so-called 6-axis motion sensor including an acceleration sensor that detects accelerations Ax, Ay, and Az in the directions along the three axes and an angular velocity sensor that detects angular velocities ωx, ωy, and ωz around three axes.

The inertial measurement unit 2000 is a rectangular parallelepiped having a substantially square planar shape. Further, screw holes 2110 as fixed portions are formed in the vicinity of two vertices located in the diagonal direction of the square. The inertial measurement unit 2000 can be fixed to a mounted surface of a mounted body such as an automobile by passing two screws through the two screw holes 2110. By selecting parts and changing the design, miniaturization of size that can be mounted on a smartphone or a digital camera, for example, can be possible.

The inertial measurement unit 2000 has an outer case 2100, a joining member 2200, and a sensor module 2300, and has a configuration in which the sensor module 2300 is inserted inside the outer case 2100 with the joining member 2200 interposed therebetween. Further, the sensor module 2300 has an inner case 2310 and a substrate 2320.

The outer shape of the outer case 2100 is a rectangular parallelepiped having a substantially square planar shape, similar to the overall shape of the inertial measurement unit 2000, and screw holes 2110 are provided in the vicinity of two vertices located in the diagonal direction of the square. Further, the outer case 2100 has a box shape, and the sensor module 2300 is housed inside the outer case 2100.

The inner case 2310 is a member that supports the substrate 2320, and has a shape that fits inside the outer case 2100. Further, the inner case 2310 is formed with a recess 2311 for preventing contact with the substrate 2320 and an opening 2312 for exposing a connector 2330 to be described later. The inner case 2310 is joined to the outer case 2100 through the joining member 2200. Further, the substrate 2320 is joined to the lower surface of the inner case 2310 through an adhesive.

Figure 11:
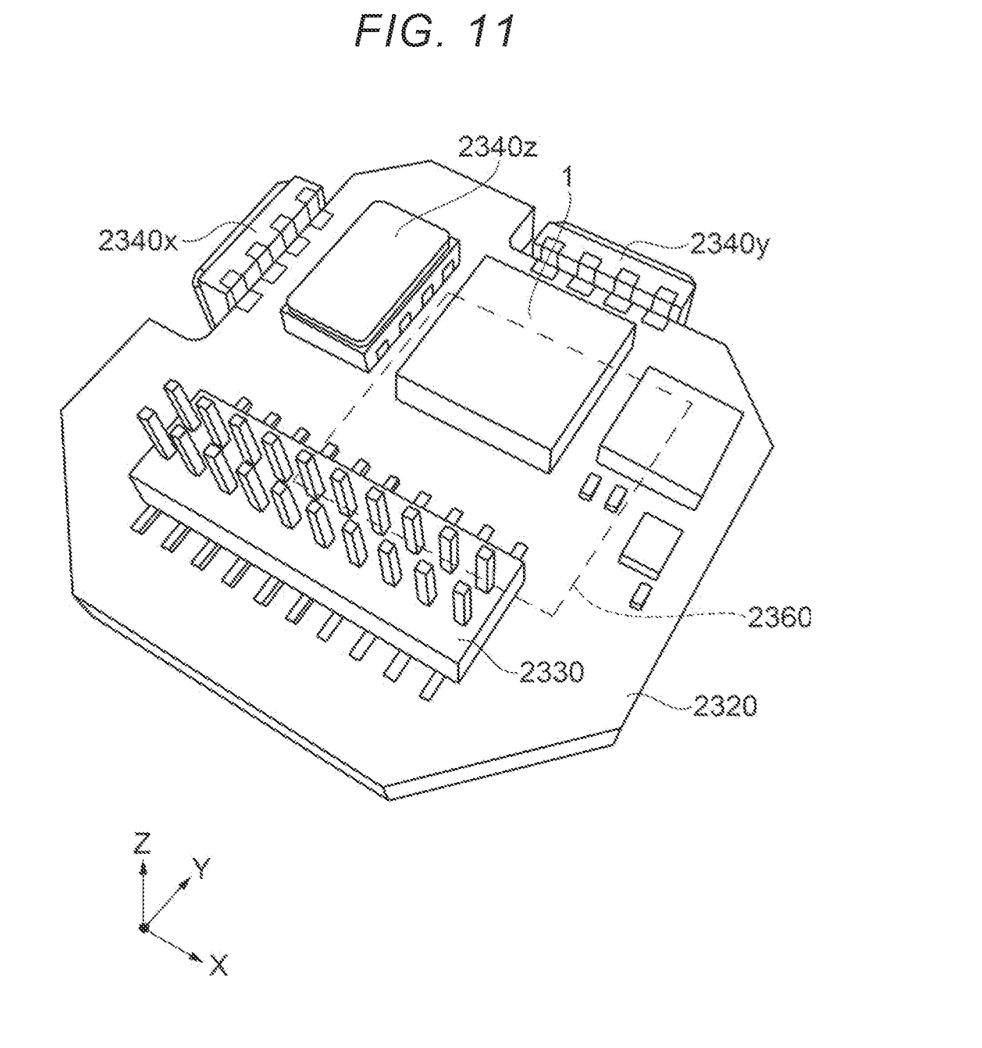
FIG. 11 is a perspective view of a substrate of FIG. 10.

As shown in FIG. 11, on the upper surface of the substrate 2320, the connector 2330, an angular velocity sensor 2340z for detecting an angular velocity around the Z-axis, and the physical quantity sensor 1 for detecting acceleration in each of the X-axis, Y-axis, and Z-axis directions, and the like, are mounted. Further, on the side surface of the substrate 2320, an angular velocity sensor 2340x for detecting the angular velocity around the X-axis and an angular velocity sensor 2340y for detecting the angular velocity around the Y-axis are mounted.

Although the physical quantity sensor 1 can detect acceleration in the triaxial direction, the physical quantity sensor 1 may detect acceleration in the uniaxial direction or the biaxial direction, if necessary. The angular velocity sensors 2340x, 2340y, and 2340z are not particularly limited, and for example, a vibration gyro sensor using the Coriolis force can be used.

Further, on the lower surface of the substrate 2320, a control IC 2360 is mounted. The control IC 2360 as a controller that performs control based on the physical quantity signal output from the physical quantity sensor 1 is a micro controller unit (MCU) and has a built-in storage including a non-volatile memory, an A/D converter, and the like to control each part of the inertial measurement unit 2000. The storage stores a program that defines the order and contents for detecting acceleration and angular velocity, a program that digitizes detection data and incorporates the digitalized data into packet data, accompanying data, and the like. In addition, a plurality of other electronic components are mounted on the substrate 2320.

Since the inertial measurement unit 2000 uses the physical quantity sensor 1, a highly reliable inertial measurement unit 2000 can be obtained.

What is claimed is:

1. A physical quantity sensor comprising:
   a physical quantity detection element coupled to a first terminal, a second terminal, and a third terminal; and
   a physical quantity detection circuit,
   wherein the physical quantity detection circuit has:
   a drive circuit that drives the physical quantity detection element;
   a signal generation circuit that generates a physical quantity signal corresponding to a magnitude of a physical quantity based on a detection signal output from the physical quantity detection element;
   a determination circuit that determines whether a value of the physical quantity signal continuously remains within a predetermined range in a predetermined period, determines that the physical quantity detection element is in a first state of normal operation when the value does not continuously remain, and determines that the physical quantity detection element is in a second state of abnormal operation when the value continuously remains;
   a control circuit that stores the physical quantity signal and setting information;
   a communication section that outputs the physical quantity signal to an outside;

a voltage generation circuit that generates a bias voltage applied to the physical quantity detection element; and switching circuits that perform switching between a coupled state and a decoupled state between the physical quantity detection element and the drive circuit and between the physical quantity detection element and the voltage generation circuit, wherein the control circuit stores first information based on a determination result of the determination circuit as the setting information, the communication section outputs the setting information stored in the control circuit to the outside when the determination result of the determination circuit indicates the second state;

when the determination result of the determination circuit indicates the first state, the control circuit controls the switching circuits to put the physical quantity detection element and the drive circuit into the coupled state and to put the physical quantity detection element and the voltage generation circuit into the decoupled state, and controls the drive circuit to repeatedly apply a first voltage, a second voltage, and a third voltage from the first terminal to the physical quantity detection element in an order of the first voltage, the second voltage, and the third voltage, and the signal generation circuit generates the physical quantity signal.

2. The physical quantity sensor according to claim 1, wherein the communication section receives second information from the outside, the control circuit stores the second information as the setting information, and the control circuit controls the switching circuits based on the second information to put the physical quantity detection element and the drive circuit into the decoupled state and to put the physical quantity detection element and the voltage generation circuit into the coupled state, and controls the voltage generation circuit based on the second information to apply a fourth voltage to the first terminal, a fifth voltage to the second terminal, and a sixth voltage to the third terminal.

3. The physical quantity sensor according to claim 2, wherein the control circuit sets the fourth voltage, the fifth voltage, and the sixth voltage output by the voltage generation circuit based on the second information.

4. The physical quantity sensor according to claim 2, wherein at least one of the fourth voltage, the fifth voltage, and the sixth voltage is a voltage obtained by boosting the second voltage.

5. The physical quantity sensor according to claim 1, wherein the communication section receives third information from the outside, the control circuit stores the third information as the setting information, in a state in which the physical quantity sensor is stopped, the control circuit controls the switching circuits based on the third information to put the physical quantity detection element and the drive circuit into the coupled state and to put the physical quantity detection element and the voltage generation circuit into the decoupled state, and controls the drive circuit based on the third information to apply a seventh voltage from the first terminal to the physical quantity detection element, and the signal generation circuit generates the physical quantity signal.

6. The physical quantity sensor according to claim 5, wherein the communication section transmits the physical quantity signal to the outside, the communication section receives, from the outside, fourth information which is the determination result of the physical quantity detection element, the control circuit stores the fourth information as the setting information, and the control circuit
controls the switching circuits to put the physical quantity detection element and the drive circuit into the coupled state and to put the physical quantity detection element and the voltage generation circuit into the decoupled state, and controls the drive circuit based on the fourth information to repeatedly apply the first voltage, the second voltage, and the third voltage from the first terminal to the physical quantity detection element in an order of the first voltage, and the second voltage, and the third voltage, when the fourth information is the determination result indicating that the physical quantity detection element is not out of order, and stops the physical quantity sensor, when the fourth information is the determination result indicating that the physical quantity detection element is out of order.

7. An inertial measurement unit comprising:

the physical quantity sensor according to claim 1; and a controller that performs control based on a physical quantity signal output from the physical quantity sensor.

8. The physical quantity sensor according to claim 1, wherein the predetermined range is set based on a maximum value detectable by the physical quantity detection element.

9. The physical quantity sensor according to claim 1, wherein the physical quantity detection element is an acceleration sensor and the predetermined range is set based on a maximum value of acceleration measurement values detectable by the physical quantity detection element.

10. The physical quantity sensor according to claim 1, wherein at least one of the switching circuits is provided between the drive circuit and the first terminal, and at least one of the switching circuits is provided between the voltage generation circuit and the first terminal.

* * * * *